June 15, 1965 P. H. FOWLER 3,189,851

PIEZOELECTRIC FILTER

Filed June 4, 1962

INVENTOR.

BY PETER H. FOWLER

Blair E. Buckles

ATTORNEYS

United States Patent Office 3,189,851
Patented June 15, 1965

3,189,851
PIEZOELECTRIC FILTER

Peter H. Fowler, Sudbury, Mass., assignor, by mesne assignments, to Sonus Corporation, Cambridge, Mass., a corporation of Delaware Filed June 4, 1962, Ser. No. 201,724
3 Claims. (Cl. 333—72)

This invention relates to an improved frequency bandpass filter constructed with piezoelectric elements, and to a circuit incorporating it. The filter has a plurality of stages, each of which comprises a pair of piezoelectric transducers assembled as an acoustical transformer that converts an electrical signal delivered to its input terminals to an acoustical signal. The acoustical signal is reconverted to an electrical signal that appears at the transformer output terminals. All the transducers in the acoustical transformers may have substantially the same resonant frequency, and yet, the frequency characteristic of the complete filter has a substantially square pass band, with sharp skirt selectivity.

In general, bandpass filters are used in electric circuits to pass only those signals having frequencies within a specified pass band. In an audio circuit, for example, a bandpass filter may be used to pass the desired audio signal with substantially no attenuation and yet exclude low frequency signals, such as 60 cycle pickup, and high frequency signals, such as harmonics of the desired signal. A sharp cut-off characteristic, or sharp skirt selectivity, is desired so that frequencies just outside the pass band are substantially completely rejected. Furthermore, it is desirable that a bandpass filter have negligible attenuation within the pass band, so that the filter operates with uniformly high efficiency on signals within the band. In addition, uniform attenuation within the pass band preserves the relative amplitudes of the selected signals.

Prior to the present invention, piezoelectric bandpass filters have been constructed according to standard filter theory with several stages, each tuned to different resonant frequencies, to achieve a desired frequency characteristic. This requires the manufacture and stocking of piezoelectric transducers having different resonant frequencies.

It is a principal object of the present invention to provide an improved bandpass filter and a frequency sensitive circuit incorporating it.

A further object of the invention is to provide a bandpass filter that has a relatively low cost construction.

Another object of the invention is to provide an improved bandpass filter having light weight and a minimum space requirement.

Yet another object of the invention is to provide a filter of the above type that has low attenuation within the pass band and high rejection outside the pass band.

Other objects of the invention will in part be obvious and will in part appear hereinafter.

The invention accordingly comprises the features of construction, combinations of elements and arrangements of parts which will be exemplified in the constructions hereinafter set forth and the scope of the invention will be indicated in the claims.

For a fuller understanding of the nature and objects of the invention, reference should be had to the following detailed description taken in connection with the accompanying drawings, in which.

In general, the present filter incorporates several identical acoustical transformers in cascade, each of the filters comprising a pair of piezoelectric transducers. Acoustical coupling is provided between joined faces of the paired transducers, an electrode being disposed between these faces to serve as a common terminal for the transformer. An electrode is also formed on the other face of each transducer, so that each transformer has, in addition, an input and an output terminal. The transformers are described in detail in the copending application of Fowler et al., Serial No. 196,840, assigned to the assignee of this application.

The acoustical transformers are connected in series to constitute the filter, and each transformer is tuned to substantially the same resonant frequency. However, the frequency characteristic of the complete filter is substantially different from the characteristic of a single transformer, having a substantially square pass band and sharp skirt selectivity. This should be contrasted to the narrow peak resulting from the cascading of conventional tuned circuits.

Single piezoelectric transducers tuned to resonant frequencies different from those of the acoustical transformers can be incorporated in the filter to achieve still sharper cut-off characteristics, i.e., sharper skirt selectivity.

Figures 1, 2, 3:
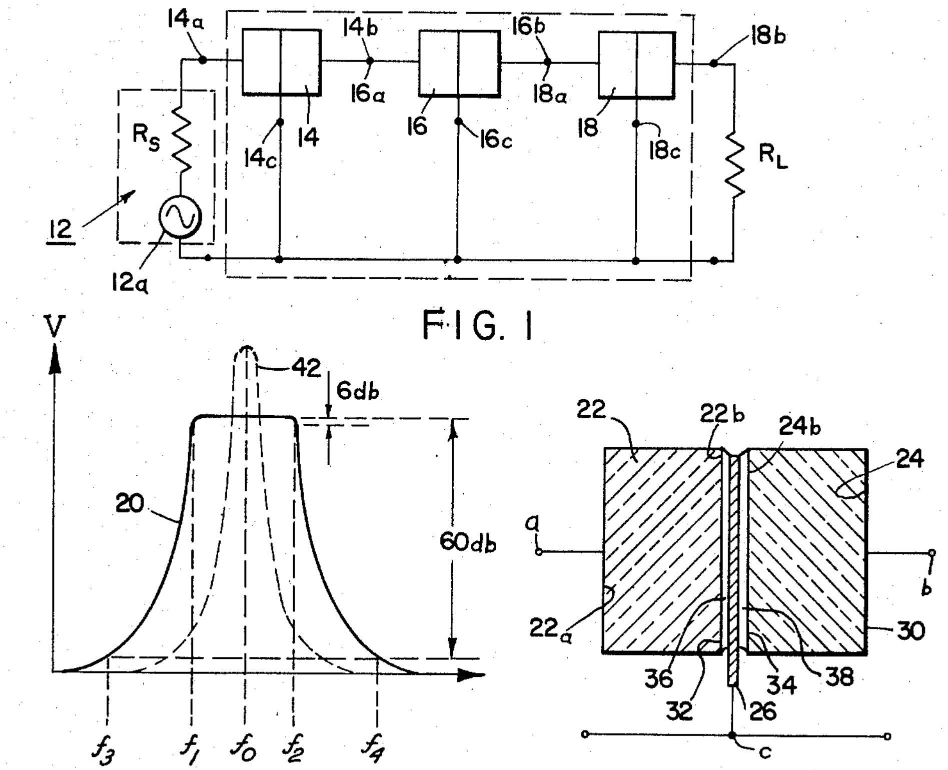
FIG. 1 is a schematic diagram of a frequency selective circuit incorporating a bandpass filter embodying the present invention.
FIG. 2 is a graph of the output voltages from the filter of FIG. 1, and of a separately-connected component thereof, plotted as a function of frequency.
FIG. 3 is a side sectional view of an acoustical transformer for use in the filter of FIG. 1.

Referring now to FIG. 1, a frequency selective circuit incorporating the present invention includes a bandpass filter generally indicated at 10 that couples electric energy from a source 12 to a load indicated by a resistor $R_L$. The source has an internal impedance shown schematically as a resistor $R_S$.

The filter 10 comprises identical acoustical transformers 14, 16 and 18, each having input, output and common terminals *a*, *b* and *c*, respectively. As described below in greater detail, each acoustical transformer comprises a pair of piezoelectric transducers, each tuned to the same resonant frequency and converts electric signals delivered to its input terminals *a* and *c* to mechanical or acoustical signals which are reconverted to electrical signals appearing between the transformer terminals *b* and *c*.

Curve 20, FIG. 2, represents a typical frequency characteristic 20 of the bandpass filter 10. The graph is a simplified plot of the voltage V across the resistor $R_L$ as a function of the frequency of the source 12. It can be seen that a substantially large voltage is delivered to the resistor $R_L$ within the pass band, i.e., between the frequencies designated $f_1$ and $f_2$.

Turning now to FIG. 3, the acoustical transformers 14, 16 and 18 (FIG. 1) are piezoelectric devices and are preferably constructed with substantially identical polarized ceramic transducers 22 and 24 bonded together with a common conductor 26, which serves as the common transformer terminal *c*, between them. Input and output electrodes 28 and 30, respectively, are formed on the transducer faces 22*a* and 24*a*, and electrodes 32 and 34 are formed on the transducer inner faces 22*b* and 24*b*, respectively. In most applications, the transducers 22 and 24 are circular disks, and the acoustical transformer is a short cylinder.

The conductor 26, which may be of thin metallic foil, is mutually secured to the electrodes 32 and 34 by thin films 36 and 38 of a suitable cement such as a hard setting epoxy resin capable of transmitting acoustical energy with minimum loss. Before the resin sets, the transducers 22 and 24 are clamped tightly together to sequeeze out excess resin. The clamping also brings the conductor 26 into contact with the electrodes 32 and 34 by way of the small projections invariably to be found on these parts.

According to an alternate construction, not shown, the common conductor 26 may be formed of two separate metallic foils soldered to the electrodes 32 and 34, respectively, and the transformer held together by a cement film thick enough to separate the electrodes 32 and 34. This construction provides isolation between the two "common" conductors, which may be desirable in some circuits.

The over-all thickness of the bonding system holding the transducers 22 and 24 together may be less than a half mil (0.0005 inch) and should, in general, be a small fraction of an acoustical wavelength at the operating frequency to prevent reflections in the bonding system from significantly affecting the frequency response of the acoustical transformer. Preferably, the entire transducer surfaces 22*b* and 24*b* are bonded to maximize acoustical coupling between them. Also, the conductor 26 should extend throughout substantially the entire bonded region. Thus, interfering reflections due to differences in acoustical impedance in the bonding region are minimized. Contact between the conductor 26 and the electrodes adjacent thereto may be enhanced by "loading" the resin of the films 36 and 38 with silver particles to render them electrically conductive.

When the transducers 22 and 24 are polarized in the axial direction, i.e., perpendicular to the transducer faces 22*a* and 24*a*, the acoustical transformer can resonate in either of two fundamental modes, as well as harmonics thereof, when excitation is applied between the electrodes 26 and 28. The modes are an axial, or thickness, mode and a transverse, or radial, mode. These resonances, which may be termed "internal resonances," correspond to maximum amplitude of vibration of each transducer 22 and 24 for a given voltage at the source 21 (FIG. 1). Each internal resonance is a composite of a "mechanical" resonance and an "electrical" resonance which are slightly spaced apart in frequency. At the electrical resonance, the alternating current through the transducer 22 for a given voltage is a maximum, and, at the mechanical resonance, the acoustical output for a given current is maximized. Between these two resonances is the internal resonance frequency, at which a given voltage applied between the electrode 26 and one of the electrodes 28 and 30 provides a maximum acoustical output. It should be noted that the electrical resonance has no direct connection with the capacitance between the electrodes 26 and 28.

The electrical and mechanical resonances described above correspond to the series and parallel resonances, respectively, of the equivalent electric circuit for the transducer. At the series resonance the equivalent circuit has a minimum impedance, and it has maximum impedance at the parallel resonant frequency.

Still referring to FIG. 3, with axial polarization of the transducers 22 and 24, an alternating voltage between the electrodes 28 and 26 causes expansion and contraction of the transducer 22 in the axial direction. It will be apparent that, with the internal compliance and mass of the unit, there is a thickness resonance mode in this direction. The other, radial, mode results from the fact that, as the transducer 22 expands and contracts in the axial direction, it contracts and expands in the radial direction according to Poisson's ratio. This effect is at a maximum at a frequency generally different from that of the thickness resonance. More particularly, the frequency of the thickness resonance depends, for a given material, on thickness, and for a thin disk the frequency of the radial resonance depends on the diameter.

The vibrations that result from electrical excitation of the transducer 22 are coupled to the transducer 24, where they produce an output voltage that appears between the electrodes 26 and 30. The output voltage is a function of the vibrational amplitude and, therefore, is at a maximum at the internal frequency of the acoustical transformer. The transformer, therefore, operates as a tuned filter between its terminals *a* and *b*.

I have found the radial mode to be preferable to the thickness mode, since it provides tighter acoustical coupling between the two transducers used in the transformer. That is, with electrically-excited radial vibrations in the transducer 22 the bonding of the face 22*b* to the face 24*b* constrains the transducer 24 to vibrate in unison. In the thickness mode, on the other hand, part of the acoustical energy goes into coherent translatory motion of the transducer 24, rather than vibratory motion. The over-all efficiency is therefore substantially less.

Also, at low frequencies such as those used in the intermediate frequency (IF) stages of broadcast receivers, the thickness mode requires a considerable axial dimension. This, in turn, adversely affects the electrical input and output impedances in many applications, and the diameter must then be increased to compensate. As a result, the size of the transformer is substantially increased, and there are deleterious effects resulting from interaction between the thickness and radial modes of operation.

Referring again to FIG. 1, each of the substantially identical transformers 14, 16 and 18 may have a resonant frequency, i.e., frequency at which the voltage between transformer terminals *b* and *c* is a maximum for a given voltage applied between the terminals *a* and *c*, in the broadcast intermediate frequency range, for example. The internal resonant frequencies of the transformers are within a few hundred cycles of each other, and it is preferable that the transformer with the highest resonant frequency be connected adjacent the source 12, and that the lowest resonant frequency transformer be connected to the load $R_L$. Each of the two disk-like transducers that compose each of the transformers 14, 16 and 18 preferably has a diameter in the neighborhood of 0.25 inch and a thickness of 0.014 inch. The disks are separated by a gap of 0.0005 inch. The dielectric constant of the ceramic material constituting the body of each transducer is about 12,000. For these values a suitable transducer material is a lead zirconate-lead titanate ceramic of the type disclosed in U.S. Patent No. 2,708,244. It will be apparent that other materials known in the art are also suitable for use in the transformers described herein. These materials include barium titanate, lead metaniobate and other ceramic transducer materials, as well as mixtures of the various compounds. With radial mode operation, the radius of the disks varies according to the characteristics of the material as is well known in the art. Moreover, the non-ceramic materials such as quartz, etc., may be used.

The electrical impedances of the transformers depend on the capacitance, a function of dielectric constant and thickness for the above configuration, and also on the internal electro-acoustical properties. The latter properties are functions of the materials of which the transducers are comprised. In the following example of circuit parameters and characteristics, it is assumed that transformers substantially conforming to the above description are used.

Referring again to FIG. 2, the single-transformer frequency characteristic curve 42, a simplified typical plot of the output voltage when an alternating excitation voltage is applied between the terminals *a* and *c* and a resistive load is connected to output terminals *b* and *c*, exhibits a sharp resonance at the internal resonance frequency $f_0$. The frequency $f_0$ is assumed to be around 400 kilocycles; the internal resistance of the source 12 is 10,000 ohms and the load resistance is between 200 and 5000 ohms, preferably about 1000 ohms.

It has been found that these same parameters, i.e., $R_s$=10,000 ohms and $R_L$=200 to 5000 ohms, are suitable for operation of the circuit of FIG. 1 to obtain the characteristic curve 20 in FIG. 2, with $f_0$ again at around 400 kilocycles. The frequencies designated $f_1$ and $f_2$, FIG. 2, preferably correspond to the electrical (series resonant) and mechanical (parallel resonant) frequencies, respectively, of the filter 10. At the frequencies $f_1$ and $f_2$, the voltage of the pass band characteristic curve 20 is 6 db (corresponding to a power ratio of 1/2) below the level at the frequency $f_0$. The output voltage from the filter 10 is 60 db (corresponding to a voltage ratio of 1000) below the level at $f_0$ at frequencies designated $f_3$ and $f_4$, whose difference is roughly equal to 5 or 6 times $f_2-f_1$. In other words, the 60 db bandwidth is only 5 or 6 times the 6 db bandwidth. With a given center frequency $f_0$, the half-power frequencies $f_1$ and $f_2$ can be adjusted by controlling the polarization intensity of the transducers.

Referring again to FIG. 1, within the pass band, i.e., between $f_1$ and $f_2$ (FIG. 2), the transfer of energy through the filter 10 is highly efficient, with substantially no power loss in the acoustical transformers 14, 16 and 18. However, the transfer of energy is drastically attenuated outside the pass band. More generally, the transfer of power through an acoustical transformer is efficient, with a loss under 1 db, when it operates from a relatively high impedance source ($R_s$=10,000 ohms) into a load having an impedance between 200 and 5000 ohms. When the load impedance is other than between 200 and 5000 ohms, the transfer of energy to the load decreases markedly. It has been found that the transformer impedances between the terminals *a* and *c* vary with frequency and are within the 200 to 5000 ohm range around the internal resonance frequency $f_0$.

More specifically, with the above values of the various parameters, the input impedance of the transformer 18, i.e., the load impedance of the transformer 16, is within the 200–5000 ohm range within the half-power frequencies and outside this range at other frequencies. Thus, the transfer of power by the transformer 16 is uniformly high between the half-power frequencies and greatly diminished outside this range. Essentially the same analysis applies to the realtionship between the transformers 14 and 16. This is not apparent from mere observation of the voltages between ground and the terminals 14*b* and 16*b*. These voltages exhibit large variations with frequency.

The number of stages in the filter may be varied, although for most purposes three stages are satisfactory. This number generally provides sufficient skirt selectivity without undue pass-band attenuation.

A further characteristic exhibited by the acoustical transformers 14, 16 and 18 is that the resonant frequency $f_0$ varies with the source and load resistances connected between the terminals *a* and *c* and *b* and *c*, respectively. For example, when the source has an internal resistance of 10,000 ohms and the load resistance is 500 ohms, the transformer may exhibit an internal resonance at 454 kilocycles. When the load impedance is changed to 5000 ohms, the resonance appears at 456 kilocycles, a lower source impedance being required to obtain a resonance at 454 kilocycles. In addition, when the load impedance has the higher value of 5000 ohms, the resonance appears at 457 kilocycles when the source impedance is increased.

As mentioned above, transformers 14, 16, 18 are preferably the same although as noted at see column 4 lines 24–35, they may have somewhat different frequencies of internal resonance. Each of the transformers, if connected separately between source 12 and $R_L$, would have a response curve represented by 42, FIG. 2. However, when they are connected in cascade in the circuit of FIG. 1, and the load on the last transformer has an impedance between 200 and 5,000 ohms and the source delivers a voltage having a frequency intermediate the series and parallel resonance frequencies of the several transformers, the response curve, instead of being sharp as would be expected, becomes more nearly square and there is high energy transfer from source to load for source frequencies between these two frequencies.

The reason for this observed result is not completely understood, but it involves the interaction between the transformers connected in cascade, causing changes in the operating characteristics of each transformer depending on its position in the circuit. Thus, in the circuit of FIG. 1, as long as $R_L$ is within the stated range, and the source 12 delivers a frequency intermediate the series and parallel resonance frequencies of transformer 18, as noted at see column 5 lines 20–24, that transformer will operate with high efficiency and furthermore have an input impedance which is also within the stated 200–5,000 ohm range. This impedance is, of course, not necessarily the same as the impedance of $R_L$.

The transformer 18 input impedance provides a load of the proper impedance at the output of transformer 16 so that the latter also operates efficiently and has the desired 200–5,000 ohm input impedance as a load for the transformer 14. Again, the impedance connected to the output of transformer 14 is not necessarily the same as those of the loads on the other two transformers.

As stated above at see column 5 lines 61–64, the operation and frequency of internal resonance of each transformer depends upon its particular source and load impedances. These being different when the circuit of FIG. 1 operates as described above, each transformer in the circuit has a slightly different frequency of internal resonance even though when individually placed between source 12 and $R_L$ the resonance frequencies may be essentially the same. This is undoubtedly why, as noted above, the filter 10 may comprise transformers having somewhat different frequencies of internal resonance.

In any event, the internal resonance and impedances at the input and output of any one transformer affect the others. A balance is achieved in the circuit which results in the filter 10 having the observed frequency characteristics represented by curve 20, FIG. 2, and characterized by a more nearly square pass band, negligible attenuation within the pass band, and sharp skirt selectivity.

As noted above, the filter frequency characteristic curve 20 (FIG. 2) was obtained with a source having an internal impedance of around 10K ohms and a load impedance around 1000Ω. These values, providing a step down in voltage between the source and the load, are particularly suitable for use in transistor circuits, where high output impedances and low input impedances are often encountered.

A further characteristic of the acoustical transformers 14, 16 and 18 and the filter 10 is that they are reciprocal. Selected terminals are designated as input or output terminals for convenience only. For example, assume that with the circuit of FIG. 1, there is a voltage step down between the source 12 and the load $R_L$ of $1/A$. When the excitation 12*a* is connected in series with the load $R_L$, the voltage appearing across the resistor $R_S$, still connected between terminals 14*a* and 14*c*, is A times the excitation voltage, i.e., a voltage step-up is observed equal to the inverse of the voltage step-down. Furthermore, when the source 12 and the load $R_L$ are interchanged, the circuit behavior is unchanged from the performance observed with the original circuit of FIG. 1.

Figure 4:
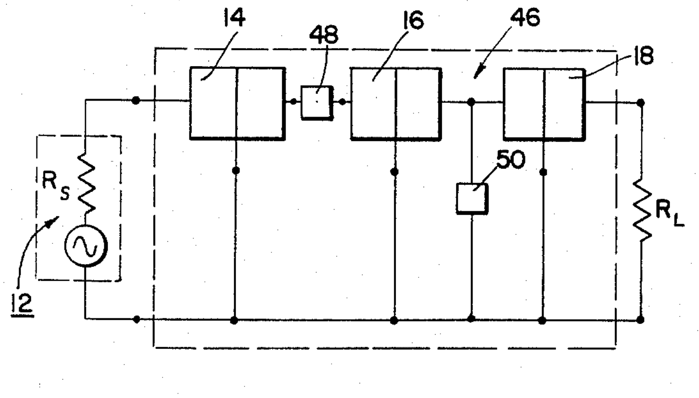
FIG. 4 is a schematic diagram of a circuit incorporating another bandpass filter embodying the present invention.

Referring now to FIG. 4, a bandpass filter generally indicated at 46 couples electrical energy from a source 12 to a load impedance again indicated as $R_L$. Filter 46 includes acoustical transformers 14, 16 and 18 connected as in the filter 10 of FIG. 1 and, in addition, it incorporates single piezoelectric transducer elements 48 and 50 to achieve a passband characteristic having sharper skirt selectivity than provided by the filter 10.

Figure 5:
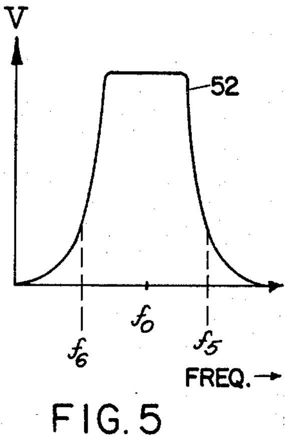
FIG. 5 is a graph of the output voltage plotted as a function of frequency for the filter of FIG. 4.

More specifically, the frequency characteristic of the filter 46 is represented by the curve 52 of FIG. 5, which is a plot of the voltage across the load $R_L$ as a function of frequency. The sharper skirt selectivity in FIG. 5 is obtained as follows.

Filter element 48, connected in series between the transformers 14 and 16, has a mechanical, or parallel, resonance at the frequency indicated in FIG. 5 as $f_6x$ and the element 50, connected in parallel with the terminals 16c and 16b, has an electrical, or series, resonance at the frequency indicated in FIG. 5 as $f_5$. At the parallel resonance, $f_5$, filter element 48 appears as a high impedance between the transformers 14 and 16, and, accordingly, substantially no power is transferred from the source 12 to the load $R_L$. At frequencies above parallel resonance, the impedance of the element 48 is very low and therefore this element has negligible effect on the operation of the filter at such frequencies. In this manner, the element 48 serves to provide a sharper cut off characteristic on the low frequency side of the pass band.

Similarly, the element 50 exhibits a minimum impedance at its series resonant frequency $f_6$ and thus shunts power transferred by the transformers 14 and 16 from source 12 to the common terminal. This effect is additive to the loss in efficiency of the transformers because of the decrease in load impedance thereof. Accordingly, substantially no power is transferred to the load $R_L$ at the frequency $f_5$, whereby the curve 52 has a sharper cut off characteristic at its low frequency skirt. The impedance of the element 50 is relatively high below the series resonant frequency and therefore this element does not materially affect operation within the pass band of the filter.

The filter elements 48 and 50 may be constructed like the transducers 22 and 24 of FIG. 3. Thus, they may have polarized ceramic bodies provided with electrodes on opposite faces thereof.

In summary, I have described improved bandpass filters constructed with a plurality of acoustical transformers each tuned to substantially the same resonant frequency. Without requiring filter stages tuned to different frequencies, the filters provide a substantially square passband characteristic, i.e., minimum and uniform attenuation within the pass-band and a high attenuation outside the band.

The acoustic transformers that constitute the filters have extremely small size and require no external power supply or control equipment. Furthermore, they lend themselves to low cost construction techniques and do not require tuning adjustments after fabrication.

The acoustical transformers may be combined with other filter elements, tuned to different resonant frequencies, according to conventional filter theory to further increase skirt selectivity.

It will be noted that, while I have specifically disclosed a given set of circuit parameters and geometrical configurations, other values can be employed in practicing the invention.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A filter comprising a series of at least two acoustical transformers, each of said transformers comprising first and second disc-shaped, axially polarized, piezoelectric transducers having opposite electroded faces, said transducers being juxtaposed in closely spaced face-to-face relation, thin bonding means including conducting means between said transducers, said bonding means covering substantially the entire opposing faces of said transducers, said bonding means effecting close acoustical coupling between said transducers, each of said transducers exhibiting an electrical resonance at a first frequency and a mechanical resonance at a second frequency, a signal source having a first impedance, said signal source delivering a signal at a selected frequency intermediate said mechanical and electrical resonant frequencies of said transducers, a load having a second impedance less than said first impedance, means connecting the opposite electroded faces of said first transducer of the first transformer of said series to said source, means for connecting the opposite electroded faces of said second transducer of the last transformer of said series to said load and means for electrically connecting in cascade the remaining transducers of the filter.

2. The filter defined in claim 1 having a third acoustical transformer substantially identical to said first and second transformers, means connecting a terminal of said third transformer to said second terminal of said second transformer.

3. A filter comprising, in combination, first and second acoustical transformers, each transformer comprising first and second disk-shaped piezoelectric transducers having first and second opposing faces; said first faces in each transformer being acoustically coupled together and having an electrode connected thereto, said electrodes being connected to a common terminal, first and second terminals secured to said second transducer faces of each transformer, means connecting together said first terminals to connect said transformers in cascade, each of said transducers exhibiting an electrical resonance at a first frequency and a mechanical resonance at a second frequency, each transformer independently developing a maximum voltage between one terminal thereof and said common terminal when a voltage having a third frequency is applied between the other terminal thereof and said common terminal, said third frequency being intermediate said first and second frequencies and having substantially the same value for said first and second transformers, each of said transformers transferring maximum electrical power between said terminals thereof to a load having a given range of impedance values, and a load having an impedance within said range connected between said common terminal and said second terminal of said first transformer, and series and shunt connected piezoelectric transducers, said series transducer having a mechanical resonance at a frequency slightly below said first frequency and said shunt transducer having an electrical resonance at a frequency slightly above said second frequency.

References Cited by the Examiner

UNITED STATES PATENTS

| | | | |
|---|---|---|---|
| 2,267,957 | 12/41 | Sykes | 333—72 |
| 2,695,357 | 11/54 | Douley | 333—72 |
| 2,830,274 | 4/58 | Rosen | 333—72 |
| 2,877,432 | 3/59 | Mattiat | 333—72 |
| 2,975,354 | 3/61 | Rosen | 333—72 |
| 2,988,714 | 6/61 | Tehon | 333—72 |
| 3,015,789 | 1/62 | Honda et al. | 333—71 |
| 3,051,919 | 8/62 | Faulk et al. | 333—72 |
| 3,078,427 | 2/63 | Poschenrieder | 333—72 |

HERMAN KARL SAALBACH, *Primary Examiner.*